United States Patent

Schindler

[11] Patent Number: 6,054,650
[45] Date of Patent: Apr. 25, 2000

[54] MODULE CARRIER

[75] Inventor: Walter A. Schindler, Zürich, Switzerland

[73] Assignee: Elma Electronic AG, Wetzikon, Switzerland

[21] Appl. No.: 09/065,674

[22] Filed: Apr. 23, 1998

[30] Foreign Application Priority Data

Apr. 25, 1997 [DE] Germany ............ 297 07 528 U

[51] Int. Cl.$^7$ .................................................. H01J 5/00
[52] U.S. Cl. ........................ 174/50; 174/57; 174/58; 220/4.02; 312/263; 312/265.5
[58] Field of Search ........................ 174/48, 50, 57, 174/58, 67; 220/4.02, 4.28, 617, 242; 312/223.2, 257.1, 263, 265.5

[56] References Cited

U.S. PATENT DOCUMENTS

| | | | |
|---|---|---|---|
| 3,410,441 | 11/1968 | Rhyne | 312/263 |
| 3,913,774 | 10/1975 | Vajtay | 220/617 |
| 4,765,698 | 8/1988 | Dooley | 312/265.5 |
| 5,263,606 | 11/1993 | Dutt et al. | 220/617 |
| 5,743,606 | 4/1998 | Scholder | 312/223.2 |
| 5,894,106 | 4/1999 | Schwenk et al. | 174/50 |
| 5,918,956 | 7/1999 | Scholder | 312/223.2 |

FOREIGN PATENT DOCUMENTS

| | | | |
|---|---|---|---|
| 8903223 U | 6/1989 | Germany. | |
| 9209519 U | 10/1992 | Germany. | |
| 4215182A1 | 11/1993 | Germany. | |
| 19515934C1 | 1/1997 | Germany. | |
| 2209460 | 5/1989 | United Kingdom | 312/263 |
| 2212668 | 7/1989 | United Kingdom | 174/50 |

*Primary Examiner*—Dean A. Reichard
*Assistant Examiner*—Dhiru R Patel
*Attorney, Agent, or Firm*—Townsend and Townsend and Crew LLP

[57] ABSTRACT

With the invention, for a module carrier, combinations are shown of sheet metal covers with a longitudinal section which has a through-going slit for the insertion of an edge of a sheet metal cover. Since the edge is interrupted by slits or cut-outs in order to form resilient tongues and the tongues bordering on a slit have an oppositely protruding contact knob, the tongues can be provided with a bias stress when being inserted and produce a contact and holding force.

13 Claims, 2 Drawing Sheets

$$a > b > \tfrac{1}{2}(a+c)$$

MODULE CARRIER

BACKGROUND OF THE INVENTION

The invention relates to a module carrier with a sheet metal cover and with a longitudinal section which has a through-going slit for the insertion of an edge of the sheet metal cover.

Module carriers for electrical and electronic components are for example defined in the norms of the IEC (International Electrotechnical Commission) standards for the chasses and components of the 19-inch technology, and the most varied of manufacturers offer module carriers in this technology. Thus a brochure of the company Knürr AG, Schatzbogen 29, D-81829 Munich, shows a 19-inch module carrier/VME (Versa Module Eurocard) system in the 1997 catalogue of which the sheet metal cover is inserted at a front section and embossed together with it. A connection of this kind restricts the field of use of the cover sheet metal lamina and the front section.

SUMMARY OF THE INVENTION

The object of the invention is thus to provide a connection which is force-locked and repeatedly insertable between a longitudinal section with a through-going slit and the edge of a sheet metal cover.

This object is satisfied in that the edge is interrupted by slits or cut-outs in order to form resilient tongues and in that the tongues bordering on a slit or on a cut-out have an oppositely disposed contact knob, with an outer distance a of the contact knob transverse to the sheet metal lamina being greater than the width b of the through-going slit in order to produce a predetermined contact force via two oppositely disposed knobs when inserting the sheet metal lamina.

The arrangement has the advantage that definite contact forces and a non-loosening connection between the contact section and the sheet metal cover can be provided. No further intermediate elements are required for the provision of a contact of this kind, which entail additional costs and of which the material must be taken into account with respect to corrosion corresponding to its potential in the electro-chemical series. This holds especially when the knobs are pressed out of the sheet metal lamina with a tool. Since the knob dimensions are tool-dependent dimensions in such a case, they can be produced with a high precision of repeatability. Longitudinal sections result in this technology mostly from extrusion tools so that their through-going slits also fluctuate only within small tolerances. High contact pressures are thus possible, with the inserted bias-stressed tongues compensating for dimensional tolerances. A distance between two knobs which are oppositely disposed and separated by a slit can be chosen small in order to be able to produce the slit and the knobs together in one tool, for example in a CNC stamping machine. The slits with their associated knobs can then be executed with a tool at distances 1 which are different and which can be chosen. If this distance 1 is likewise chosen to be small, knobs are distributed at close spacing over the entire length of the connection and there result only small gaps for the module carrier as a Faraday cage with respect to screening.

The longitudinal section and the sheet metal lamina are made of metal. Extruded longitudinal sections of an aluminum alloy are customary. If these are connected to a sheet aluminium lamina of which the knobs are pressed out of the lamina, the susceptibility to corrosion due to different electrochemical potentials is particularly low. Sheet steel lamina can however be used without further ado.

Due to a high contact pressure achievable the knobs can brush or scrape off protective coatings and contaminations which lie between the contact point and the longitudinal section when the sheet metal lamina is inserted. In the event of a coating of the sheet metal lamina with a protective coating the baring of the knobs is therefore not obligatory.

Through the direct definite contact between the sheet metal lamina and the longitudinal section, the costs for separate contact springs are also done away with. Since a large number of oppositely stressed knob pairs are arranged along the through-going slit of the longitudinal section, the torques resulting from the displacement of the knobs cancel and the position of the sheet metal lamina is averaged out in dependence on the forces. If the sheet metal lamina are bent after the insertion slit, they can be continued further in a plane of the outer contour of the longitudinal section. The through-going slit in the longitudinal section need not necessarily be made perpendicular to the outer contour. It can also subtend an oblique angle to the outer contour. Slit forms with inlets in the form of radii or bevels are recommendable.

DESCRIPTION OF THE PREFERRED EMBODIMENTS

Figure 1:
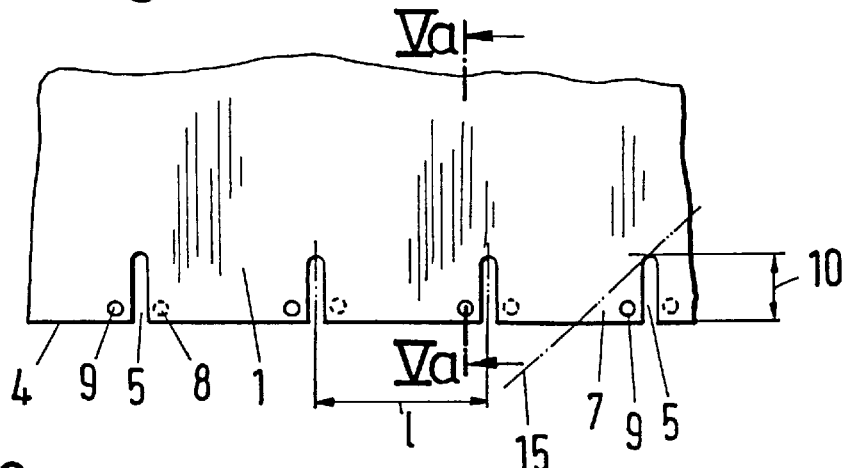
FIG. 1 illustrates schematically a section of a sheet metal cover of which the edge has oppositely disposed knobs which are spring suspended and are separated by a slit.

The figures show, for a module carrier, combinations of sheet metal covers 1 with a longitudinal section 2 which has a through-going slit for the insertion of an edge 4 of a sheet metal cover 1. Since the edge 4 is interrupted by slits 5 or cut-outs 6 in order to form resilient tongues 7 and the tongues 7 bordering on a slit 5 have oppositely protruding contact knobs 8, 9, the tongues 7 can be provided with a bias stress when inserted and produce a contact and holding force.

In FIG. 1 an edge 4 of a sheet metal cover is provided with slits 5 at distances 1 which have the same depth 10. Oppositely disposed knobs 8, 9 are in each case provided at a slit 5 near the edge 4 so that with respect to the knob 8, 9 the latter projects on a resilient tongue 7 which is bounded by the slit 5 and by a part of the edge 4 and which is continued at an imaginary clamping line 15 through the sheet metal lamina 1. The knobs bordering on a slit 5 can be produced along with the slit itself in a single deformation tool, which is advantageous for a high precision of repetition of the dimensions of the knobs, whereas the distance 1 between two slits can be freely chosen.

Figure 2:
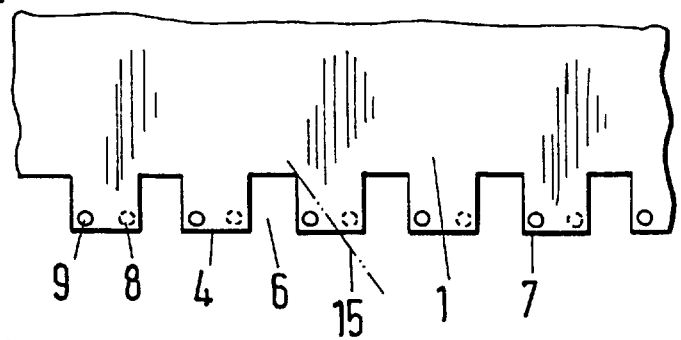
FIG. 2 illustrates schematically an embodiment analogous to FIG. 1 in which the slit was broadened to a wider cut-out.

In FIG. 2 the slits have merely been broadened to cut-outs 6 with a greater width. In a single deforming tool this width would be a tool-dependent dimension.

Figure 3:
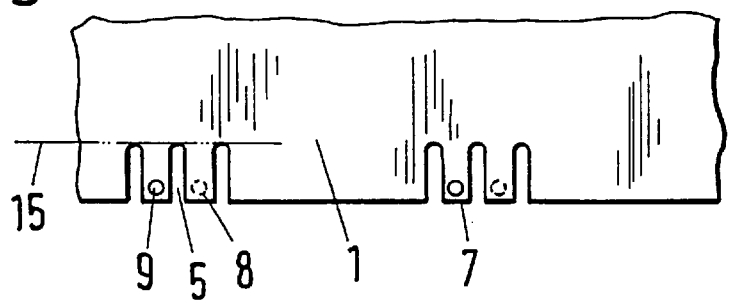
FIG. 3 illustrates schematically an embodiment analogous to FIG. 1 in which the oppositely disposed knobs each lie on a tongue which is bounded by two parallel slits.

In FIG. 3 the contact knobs 8, 9 are placed on individual tongues 7 which are in each case formed by equally deep slits extending perpendicularly to the edge 4. The imaginary clamping line 15 for the tongues 7 extends at the height of the end of the slit and parallel to the edge 4.

Figure 4:
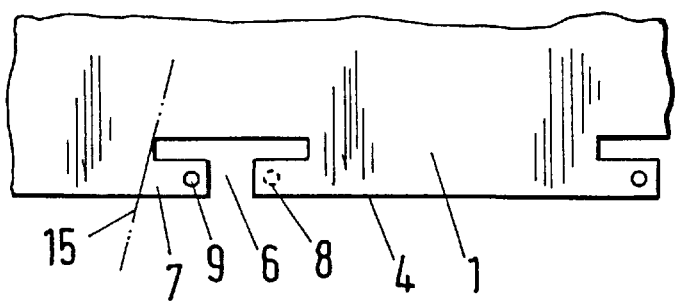
FIG. 4 illustrates schematically an embodiment analogous to FIG. 2 in which the cut-out in the sheet metal lamina is broadened in such a manner that the knobs lie on tongues which extend parallel to the edge of the sheet metal lamina.

In FIG. 4 the cut-out 6 is broadened in the inner region and parallel to the edge 4 to such an extent that tongues 7 arise which extend parallel to the outer edge 4. The imaginary clamping line 15 for the tongues 7 is displaced by a small angle from a normal to the edge 4.

Figure 5A:
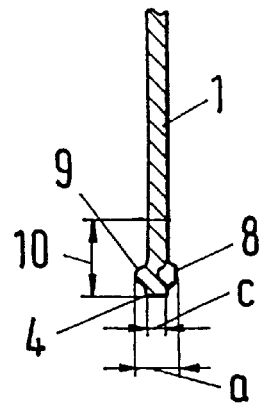
FIG. 5a illustrates schematically a section through the sheet metal lamina in accordance with FIG. 1 with oppositely disposed knobs.
Figure 5B:
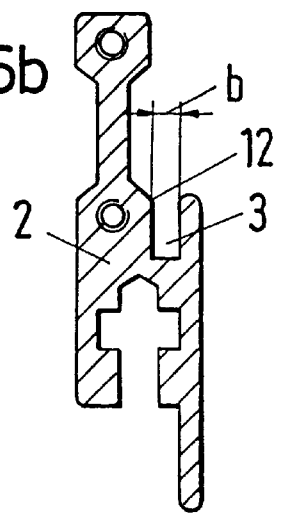
FIG. 5b illustrates schematically a section through a longitudinal section fitting with FIG. 1 with a through-going slit for the reception of the sheet metal lamina.

In FIGS. 5a, 5b the sheet metal lamina 1 and the longitudinal section 2 are shown prior to insertion of the edge 4 of the sheet metal lamina. The oppositely disposed knobs 8, 9 result in a distance a which is greater than the slit width b in order to bias stress the resilient tongue part in each case via the entering knob, whereas the slit width must amount to more than the sum of the height 16 of a knob (see FIG. 7) and the sheet metal lamina thickness c in order that the sheet metal lamina can be inserted. With the same height 16 for the knobs 8, 9 there result a height 16 of $\frac{1}{2} \cdot (a-c)$ and the condition $a > b > \frac{1}{2}(a+c)$ in order to be able to insert with certainty. The depth 10 of the non-visible slit 5 must be chosen in such a manner that no over-extension of the tongue takes place.

Figure 6:
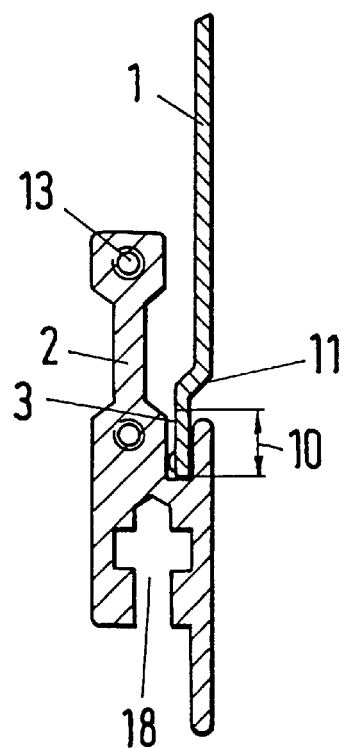
FIG. 6 illustrates schematically a doubly bent sheet metal lamina which is inserted into a longitudinal section in accordance with FIG. 5b and extends in a plane of the outer contour of the longitudinal section.

In FIG. 6 the sheet metal lamina 1 with the bend 11 and the longitudinal section 2 are shown in engagement. In addition to the through-going slit 3 a section 18 for a threaded bar and threaded bores 13 are provided on the longitudinal section for the mounting of the side parts. The longitudinal section 2 and the sheet metal lamina 1 align in a common plane.

Figure 7:
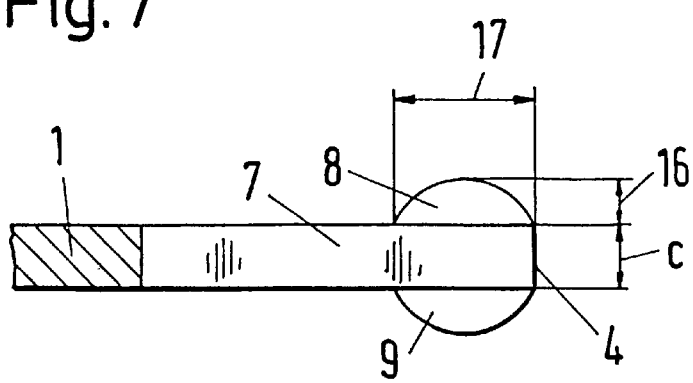
FIG. 7 illustrates schematically an enlarged section of a sheet metal lamina edge with two oppositely disposed knobs.

In FIG. 7 the knobs 8, 9 begin immediately at the edge 4 and rise gently up to a highest point of contact. In this example the knobs 8, 9 are executed with a diameter 17 as sections of spherical surfaces.

Typical dimensions for module carriers in the 19-inch technology are for example:

sheet metal lamina thickness c: 1 mm outer distance a of the knobs: 2.36 mm width of the slit in the longitudinal section: 1.8 to 2.2 mm

What is claimed is:

1. A module carrier comprising:
   a sheet metal cover having an edge, the edge being interrupted by slits or cut-outs to form resilient tongues;
   a longitudinal section having a through-going slit for insertion of the edge of the sheet metal cover,
   wherein the resilient tongues bordering on said slits or on said cut-outs have oppositely disposed contact knobs, wherein the contact knobs have an outer distance A therebetween transverse to the sheet metal cover and the through-going slit has a width B, the outer distance A being greater than the width B to produce a contact force via two said oppositely disposed knobs when the sheet metal cover is inserted into the through-going slit.

2. A module carrier in accordance with claim 1 wherein the sheet metal cover has a thickness C, and wherein the outer distance A, the width B, and the thickness C are matched to the material of the sheet metal cover in such a manner that the tongues are stressed within an elastic range upon insertion of the edge of the sheet metal cover into the through-going slit.

3. A module carrier in accordance with claim 2 wherein the dimensions of the sheet metal cover and the longitudinal section are selected such that $A > B > \frac{1}{2}(A+C)$.

4. A module carrier in accordance with claim 1 wherein the slits or cut-outs project from the edge perpendicularly into the sheet metal cover, and wherein the oppositely disposed contact knobs for each of said or cut-outs are positioned near the edge and towards the slits or cut-outs to produce imaginary clamping lines for the tongues which extend at an inclination from the end of the slit or cut-out to the edge.

5. A module carrier in accordance with claim 1 wherein the two adjacent oppositely disposed knobs are each arranged on one of said tongues which is bounded by said slits or cut-outs which are perpendicular to the edge.

6. A module carrier in accordance with claim 5 wherein the slits or cut-outs are equally deep to form an imaginary clamping line for the tongues extending parallel to the edge.

7. A module carrier in accordance with claim 1 wherein the slits or cut-outs are broadened at a depth in the sheet metal cover parallel to the edge to produce transversely lying tongues.

8. A module carrier in accordance with claim 1 wherein the sheet metal cover while inserted into the through-going slit is bent outside of the through-going slit and extends with a surface in a plane of an outer contour of the longitudinal section.

9. A module carrier in accordance with claim 1 wherein the through-going slit has inlets in a form of radii or inclined surfaces.

10. A module carrier in accordance with claim 1 wherein the contacts knobs each rise gently with a contour to a contact point which lies in a plane parallel to the plane of the sheet metal cover.

11. A module carrier in accordance with claim 1 wherein the contacts knobs are pressed out of the sheet metal cover to form a connected part.

12. A module carrier in accordance with claim 1 wherein the sheet metal cover is coated with a protective layer.

13. A module carrier in accordance with claim 1 wherein the module carrier is executed in dimensions of a 19-inch module carrier.

* * * * *